(12) United States Patent
Yu

(10) Patent No.: US 10,897,800 B2
(45) Date of Patent: Jan. 19, 2021

(54) SURFACE MOUNTED AND CHIP ON BOARD, HIGH BRIGHTNESS LED REPLACEABLE LIGHTING SYSTEM

(71) Applicant: Ledup Manufacturing Group Limited, Irwindale, CA (US)

(72) Inventor: Jing Jing Yu, Irwindale, CA (US)

(73) Assignee: Ledup Manufacturing Group Limited, Irwindale, CA (US)

( * ) Notice: Subject to any disclaimer, the term of this patent is extended or adjusted under 35 U.S.C. 154(b) by 0 days.

(21) Appl. No.: 16/396,303

(22) Filed: Apr. 26, 2019

(65) Prior Publication Data

US 2019/0353309 A1 Nov. 21, 2019

Related U.S. Application Data

(60) Provisional application No. 62/665,360, filed on May 1, 2018, provisional application No. 62/675,015, filed (Continued)

(51) Int. Cl.
*F21K 9/238* (2016.01)
*F21K 9/232* (2016.01)
(Continued)

(52) U.S. Cl.
CPC .............. *H05B 45/20* (2020.01); *F21K 9/232* (2016.08); *F21K 9/238* (2016.08); *F21K 9/66* (2016.08); *F21S 4/10* (2016.01); *F21V 3/062* (2018.02); *F21V 17/002* (2013.01); *F21V 17/06* (2013.01); *F21V 19/004* (2013.01); *F21V 21/096* (2013.01); *F21V 23/001* (2013.01); *F21V 23/02* (2013.01); *F21V 23/06* (2013.01);
(Continued)

(58) Field of Classification Search
CPC . F21K 9/232; F21K 9/238; F21K 9/66; F21V 23/06; F21V 19/004; F21V 17/002; F21V 3/062; F21V 17/06; F21V 21/096; F21V 23/001; F21V 23/02; F21V 31/005; F21S 4/10; H05B 45/20; H05B 45/40; H01R 12/714; H01R 13/5202; H01R 13/5205; H01R 33/18; H01R 33/88; H01R 43/20; H05K 1/117; H05K 1/181
See application file for complete search history.

(56) References Cited

U.S. PATENT DOCUMENTS

| 2006/0215422 A1* | 9/2006 | Laizure, Jr. ........... F21V 31/005 |
| | | 362/650 |
| 2014/0300269 A1* | 10/2014 | Wu ......................... F21K 9/232 |
| | | 313/318.01 |

(Continued)

*Primary Examiner* — Thomas M Sember
(74) *Attorney, Agent, or Firm* — Cochran Freund & Young LLC; William W. Cochran

(57) ABSTRACT

Disclosed is a LED light assembly that accommodates series connected surface mounted LEDs. An LED lighting source comprising surface mounted LEDs can be inserted and removed from a socket to allow replacement of burned out LEDs. The LED lighting source contains all of the components for controlling the intensity and color of the emitted light. In addition, the electrical components may receive control signals to control the output of the surface mounted LEDs. Connectors disposed in a socket are made of spring steel that causes the connectors to contact each other when the LED lighting source becomes loose from the socket or is removed.

7 Claims, 19 Drawing Sheets

Related U.S. Application Data on May 22, 2018, provisional application No. 62/718,835, filed on Aug. 14, 2018.

(51) Int. Cl.

| | | |
|---|---|---|
| *F21K 9/66* | (2016.01) |
| *F21V 23/06* | (2006.01) |
| *F21V 19/00* | (2006.01) |
| *F21V 17/00* | (2006.01) |
| *F21S 4/10* | (2016.01) |
| *H05B 45/20* | (2020.01) |
| *F21V 3/06* | (2018.01) |
| *F21V 17/06* | (2006.01) |
| *F21V 21/096* | (2006.01) |
| *F21V 23/00* | (2015.01) |
| *F21V 23/02* | (2006.01) |
| *F21V 31/00* | (2006.01) |
| *H01R 12/71* | (2011.01) |
| *H01R 13/52* | (2006.01) |
| *H01R 33/18* | (2006.01) |
| *H01R 33/88* | (2006.01) |
| *H01R 43/00* | (2006.01) |
| *H01R 43/20* | (2006.01) |
| *H05K 1/11* | (2006.01) |
| *H05K 1/18* | (2006.01) |
| *H05B 45/40* | (2020.01) |
| *F21Y 115/10* | (2016.01) |

(52) U.S. Cl.
CPC ......... *F21V 31/005* (2013.01); *H01R 12/714* (2013.01); *H01R 13/5202* (2013.01); *H01R 13/5205* (2013.01); *H01R 33/18* (2013.01); *H01R 33/88* (2013.01); *H01R 43/005* (2013.01); *H01R 43/20* (2013.01); *H05B 45/40* (2020.01); *H05K 1/117* (2013.01); *H05K 1/181* (2013.01); *F21Y 2115/10* (2016.08); *H05K 2201/10106* (2013.01); *H05K 2201/10545* (2013.01)

(56) References Cited

U.S. PATENT DOCUMENTS

2015/0062928 A1\* 3/2015 Mostoller .................. F21K 9/00
362/363
2015/0062929 A1\* 3/2015 Mostoller .................. F21K 9/00
362/363

\* cited by examiner

US 10,897,800 B2

SURFACE MOUNTED AND CHIP ON BOARD, HIGH BRIGHTNESS LED REPLACEABLE LIGHTING SYSTEM

CROSS-REFERENCE TO RELATED APPLICATION

This Non-Provisional patent application claims the benefit of the U.S. Provisional Patent Application No. 62/665,360, entitled "Individually Accessible Led Light System," which was filed with the U.S. Patent & Trademark Office on May 1, 2018, the U.S. Provisional Patent Application No. 62/675,015, entitled "A Surface Mounted and Chip On Board, High Brightness Led Replaceable Lighting System," filed on May 22, 2018, and U.S. Provisional Patent Application No. 62/718,835, entitled "Waterproof, Dual-Polarity Decorative Light String," filed on Aug. 14, 2018, all of which are specifically incorporated herein by reference for all that they disclose and teach.

BACKGROUND OF THE INVENTION

LEDs have become an important product for lighting. LEDs can operate at low DC voltages, and are very efficient at producing light energy. Further, LEDs do not produce a significant amount of heat and therefore are safer to use in many different environments.

SUMMARY OF THE INVENTION

An embodiment of the present invention may therefore comprise a method of connecting high brightness, surface mounted light emitting diodes mounted on a circuit board in series that allows the high brightness, surface mounted light emitting diodes to be replaced comprising: using spring steel that is biased in an outward position to form two contacts; placing two wires in an opening in a socket, the socket having a threaded surface; electrically connecting the two contacts to the two wires to form two connectors; placing the two connectors in the opening in the socket so that the two contacts are compressed against each other and form an electrical connection between the two wires; inserting an extended portion of the circuit board between the two contacts so that terminals on the circuit board are electrically connected to the two connectors, which provides electrical power to the surface mounted, high brightness light emitting diodes.

An embodiment of the present invention may further comprise an LED light assembly comprising: two wires that supply electrical power to the LED light assembly; two connectors attached to the two wires, the connectors made of spring steel that is biased in an outward direction; a socket that surrounds the two connectors so that the two connectors are compressed against each other; an LED lighting source comprising: a circuit board; a plurality of LEDs that are surface mounted on the circuit board; electrical components that are mounted on the circuit board that generate power signals that control the luminosity of the plurality of LEDs; terminals disposed on the circuit board that are electrically connected to the electrical components, the terminals disposed between the two connectors in the socket to supply electrical power and control signals from the two wires to the LED lighting source; a bulb shell that is removeably attached to the socket that provides access to the LED light source when removed from the socket.

DETAILED DESCRIPTION OF THE EMBODIMENTS

Figure 1:
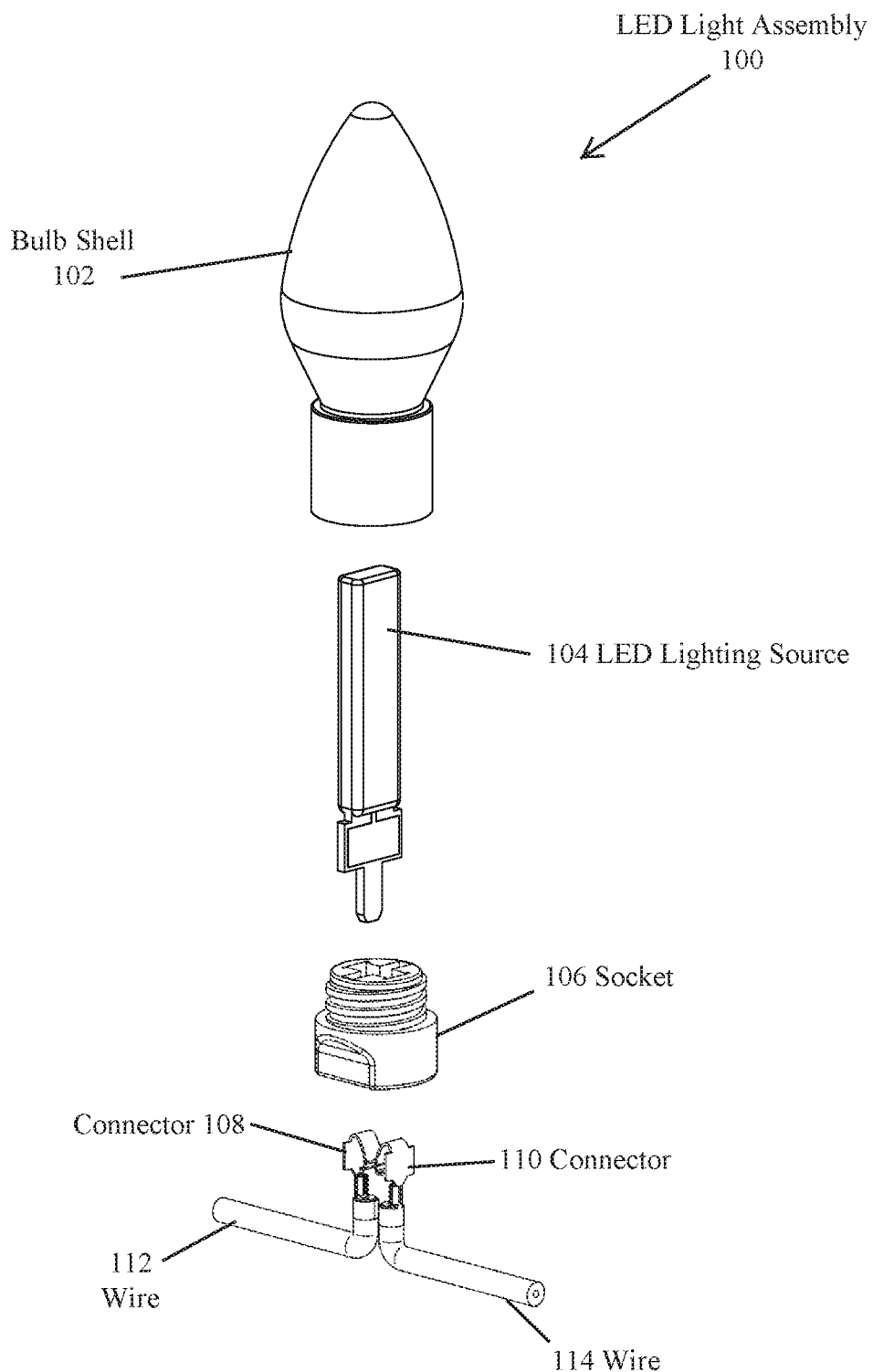
FIG. 1 is an isometric exploded view of an embodiment of an LED light assembly.

FIG. 1 is an isometric view of an LED light assembly 100 that comprises one embodiment of the invention. LED light sources have been greatly improved over the last few years as a result of Surface Mounted Device (SMD) LED technology that can produce high brightness LEDs. In addition, Chip On Board (COB) LEDs have provided high brightness from multiple LEDs on a heat dispersive substrate to achieve brightness that has not previously been available. The Surface Mounted Device LEDs and the Chip On Board LEDs can be used in decorative light strings, displays, graphic presentations, general purpose lighting and large scale imaging (collectively referred to as "lighting displays.") In order to provide these types of different lighting displays, the LEDs should be able to create a full range of colors, should be bright and should be replaceable. Further, the LEDs can be arranged in various configurations, which includes various series and parallel arrangements. A problem with series connected LEDs has been that LEDs occasionally burn out or become disconnected from the power source, which results in the other LEDs that are connected in series to that LED do not receive power downstream and become dark. This can greatly affect the lighting display. LEDs do not have the ability to continue to supply power to the series connected LEDs, if an LED becomes disconnected from the power source, or if the LED becomes burned out and cannot conduct energy to downstream LEDs. If a single LED becomes burned out, it is advantageous to be able to replace that LED to ensure that the lighting display is complete. It is also beneficial to ensure that if an LED is burned out or becomes loose from connectors of the power source, that LEDs that are downstream do not go dark, and that power is supplied to downstream, series connected LEDs.

FIG. 1 is an isometric view of an embodiment of an LED light assembly 100 that is suitable for use in a light string, such as a Christmas light string or decorative outdoor lighting. Of course, the LED light assembly can take other forms, such as mentioned above, to create various types of lighting displays including graphic displays, image displays, and general purpose lighting. In such a case, the bulb shell 102 may take a different form to fit the particular type of display in which the LED light assembly 100 is being used. As illustrated in the embodiment of FIG. 1, the bulb shell 102 has a shape of a typical Christmas tree light. The bulb shell 102 covers the LED lighting source 104 which may comprise a Surface Mounted Device LED or Chip On Board, high brightness LED 104. Surface mounted LEDs typically take the form of multiple LEDs that are connected in series. The LEDs are mounted on printed circuit boards using surface mounted technology. Chip On Board LEDs use multiple small sized chips that are normally arranged in a tight configuration on a heat dispersive substrate. Chip On Board LEDs normally have more light emitting diodes than Surface Mounted LED diodes. In Chip On Board lighting, multiple LEDs are placed directly on a heat dispersive substrate that has thermal properties that can disperse the heat from the LEDs, which allows for a higher density of placement of LEDs.

Referring again to FIG. 1, the LED light assembly 100 includes the bulb shell 102, which covers the LED lighting source 104. The LED lighting source 104 is inserted into a socket 106 containing the connectors 108, 110, which are connected to wires 112, 114. The bulb shell 102 is screwed onto the socket 106, and can be easily removed, to provide access to the LED 104. If the LED 104 burns out, the LED 104 can simply be pulled out of the socket 106 and replaced with a working LED.

Figure 2:
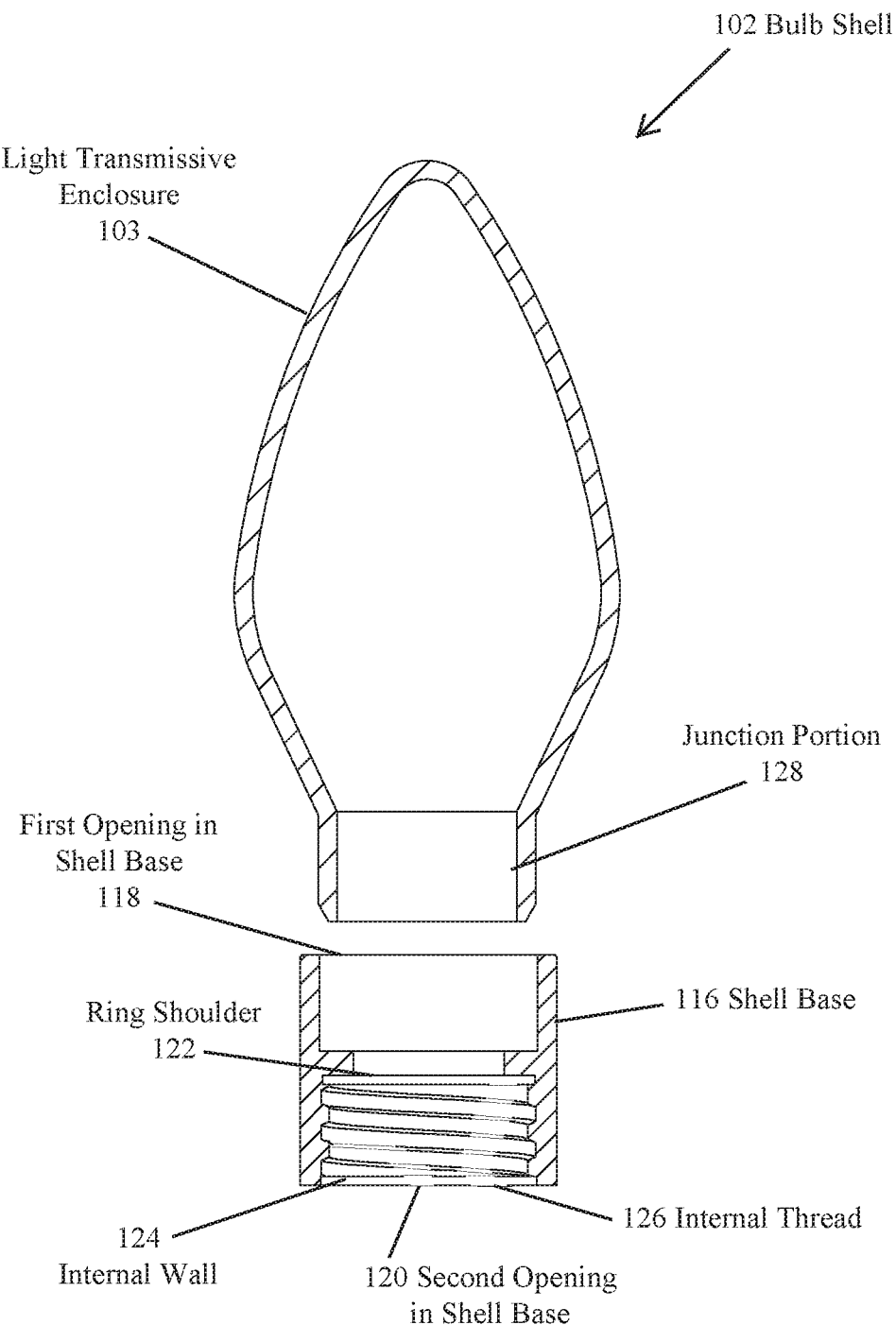
FIG. 2 is a cutaway exploded view of an embodiment of a bulb shell assembly.

FIG. 2 is a cross-sectional view of the bulb shell 102. The bulb shell 102 includes a light transmissive enclosure 103 and a shell base 116. Light transmissive enclosure 103 can be transparent, translucent, frosted and/or a light dispersive material. The light transmissive enclosure 103 has a junction portion 128 that fits into the first opening 118 in the shell base 116. The junction portion 128 can be friction fit into the first opening 118 or can be bonded using various techniques. The lower portion of the shell base 116 has internal threads 126 that extend from a ring shoulder 122 on an internal wall 124, to form the internal threads 126. The internal threads 126 extend all the way to the second opening 120 in the shell base 116.

Figure 3:
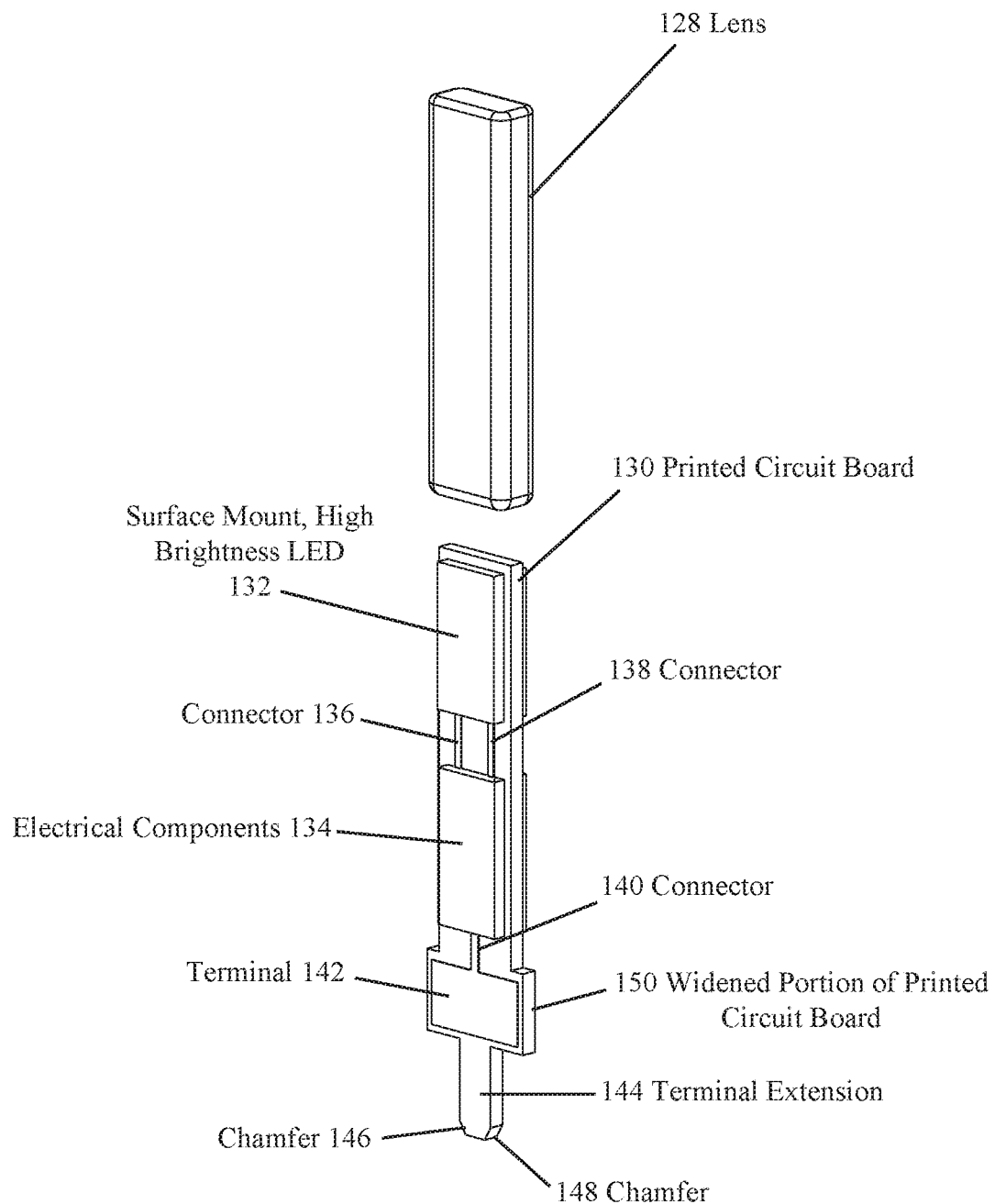
FIG. 3 is an isometric exploded view of an LED lighting source.

FIG. 3 is an isometric view of an embodiment of an LED lighting source 104. As illustrated in FIG. 3, the LED lighting source 104 utilizes a lens 128 that is placed over the LED light source 104. The lens 128 can be made of a transparent epoxy or other insulated material that covers and protects the various components of the LED lighting source 104. The lens 128 can be molded in place on the LED lighting source 104 to cover the surface mounted LEDs 132 and the electrical components 134. The lens should be an insulated material so that the lens 128 can be grasped by a user without being burned or shocked. The circuit board 130 includes the surface mount, high brightness LED 132 and other components 134 mounted on the printed circuit board 130. The LEDs 132 may also comprise Chip On Board LEDs. The high brightness LEDs 132 are surface mounted directly to the printed circuit board 130 for the surface mounted LEDs. In addition, other electrical components 134 for driving the surface mounted, high brightness LEDs 132 are also mounted on the printed circuit board 130. The surface mounted, high brightness LEDs 132 or Chip On Board LEDs 132 may comprise LEDs of different colors. For example, the LEDs may be red, green and blue, which are primary colors. By controlling the intensity of illumination of each of the different colored LEDs, virtually every color can be produced. Since the surface mounted LEDs and the Chip On Board LEDs comprise multiple LEDs, the intensity of the colors can be varied, also.

As also shown in FIG. 3, connectors 136, 138 comprise conductors disposed on the printed circuit board 130 to allow a convenient connection between the surface mounted, high brightness LEDs 132 and the electrical components 134. The electrical components 134 comprise all of the circuitry for driving the LEDs 132. In other words, the electrical components 134 may decode control signals sent through the wires 112, 114 that provide power to the LEDs to generate different intensity electrical signals for illuminating each of the LEDs by an amount specified by the control signals on the power line. This is disclosed in more detail in U.S. Patent Application Ser. No. 62/665,360 filed on May 1, 2018 by Jing Jing Yu, entitled "Individually Accessible LED Light System," which is specifically incorporated herein for all that it discloses and teaches. In this manner, each of the LED light sources 104 can be individually addressed and controlled so that graphic displays, images and other information can be provided on a lighting display when the LED light assembly 100 is connected to multiple series and parallel connected LEDs.

Referring again to FIG. 3, connector 140 is also disposed on the printed circuit board 130 and provides a connection between the electrical components 134 and the terminal 142. The printed circuit board includes a widened portion 150, which provides a seat for the LED lighting source 104 when inserted into the socket 106 (FIG. 1). The terminal 142 has a terminal extension 144, which includes chamfers 146, 148, that allow easier insertion of the terminal extension 144 into socket 106 (FIG. 1).

When the wires 112, 114 are powered with a DC signal, the terminal extension 144 can have a particular shape or position with respect to the terminal 142, which only allows the terminal extension 144 to be inserted in one orientation in socket 106. In other words, the socket 106 and the terminal extension 144 can be shaped or oriented with respect to the terminal 142 and the connectors 108, 110 to only allow the LED lighting source 104 to be inserted into the socket 106 in one orientation. This ensures that the LED lighting source 104 will not be inserted into the socket 106 in a reverse direction, which would not allow the LED lighting source 104 to operate.

Alternatively, the printed circuit board 130 can be constructed so it does not have to be shaped to be oriented in a specific direction when plugged into the socket 106. The electrical components 134 can be constructed to ensure that the LEDs 132 are lit. The printed circuit board 130 may have the exact same components, i.e., terminal 142, electrical components 134, and LED 132 mounted on the other side of the printed circuit board 130. When an AC voltage is used on wires 112, 114, such as a 117 volt RMS signal, the LEDs may illuminate each half cycle if the LEDs 132, on each side, have reversed directions, or the electrical components 134 may include an inexpensive full wave rectification, such as disclosed in U.S. Pat. No. 9,955,538 filed by Jing Jing Yu, et al., entitled "Capacitive Full-Wave Circuit for LED Light Strings," which issued on Apr. 24, 2018; U.S. Pat. No. 8,723,432 filed by Jing Jing Yu, et al., entitled "Capacitive Full-Wave Circuit for LED Light Strings," which issued on May 13, 2014; and U.S. Pat. No. 8,314,564 filed by Jing Jing Yu, et al., entitled "Capacitive Full-Wave Circuit for LED Light Strings," which issued on Nov. 20, 2012, all of which are specifically incorporated herein by reference for all that they disclose and teach. Techniques disclosed in U.S. Pat. No. 7,518,316 filed by Jing Jing Yu, entitled "Half-Wave Rectification Circuit with a Low-Pass Filter for LED Light Strings," which issued on Apr. 14, 2009, can also be used to provide a DC signal. This patent is also specifically incorporated herein by reference for all that it discloses and teaches. Also, the wires may transmit a fully rectified signal that has been rectified by a rectifier disposed in the power plug, such as disclosed in U.S. Pat. No. 9,226,351 filed by Long Chen, et al., entitled "Compact Converter Plug for LED Light Strings," which issued on Dec. 29, 2015, which is specifically incorporated herein by reference for all that it discloses and teaches. Electrical components 134 also condition the voltage and current for driving the surface mounted, high brightness LEDs 132. In addition, the electrical components 134 condition the voltage and current for the electrical power that is passed to the next LED lighting source 104 when the LED lighting assembly 100 is connected in series with additional LED lighting sources, such as LED lighting source 104.

The electrical components 134 that are disposed on each side of the printed circuit board 130 can be constructed as integrated circuits which are inexpensive as compared to the cost of other components such as the wire that is run between the LED light assemblies. In addition, when the electrical power is an AC signal, each of the LEDs 132, in a series connection, creates an impedance without resistance so that if a sufficient number of LEDs 132 are connected in series, enough impedance can be provided in an LED light string so that no resistance is required in the LED light string. In this manner, the efficiency of the LED light string is increased. If full wave rectification is utilized, the LED 132 and a similar LED on the other side of the printed circuit board 130 remain lit during a full-wave cycle of an AC electrical signal. This increases the amount of light provided by the LED lighting source 104. The full-wave rectifier doubles the light output of each of the LEDs 132. In this way, the overall cost of the LED light string 100 is minimized and provides a significant amount of light at an inexpensive price having great reliability and longevity. Further, the printed circuit board 130 can be inserted in either direction and still be capable of creating a full-time source of light using the full-wave rectification circuits referenced above. The use of surface mount LEDS having high intensity, or (COB) Chip OnBoard LEDs, also increases the amount of light that can be produced by the LEDs 132.

Figure 4:
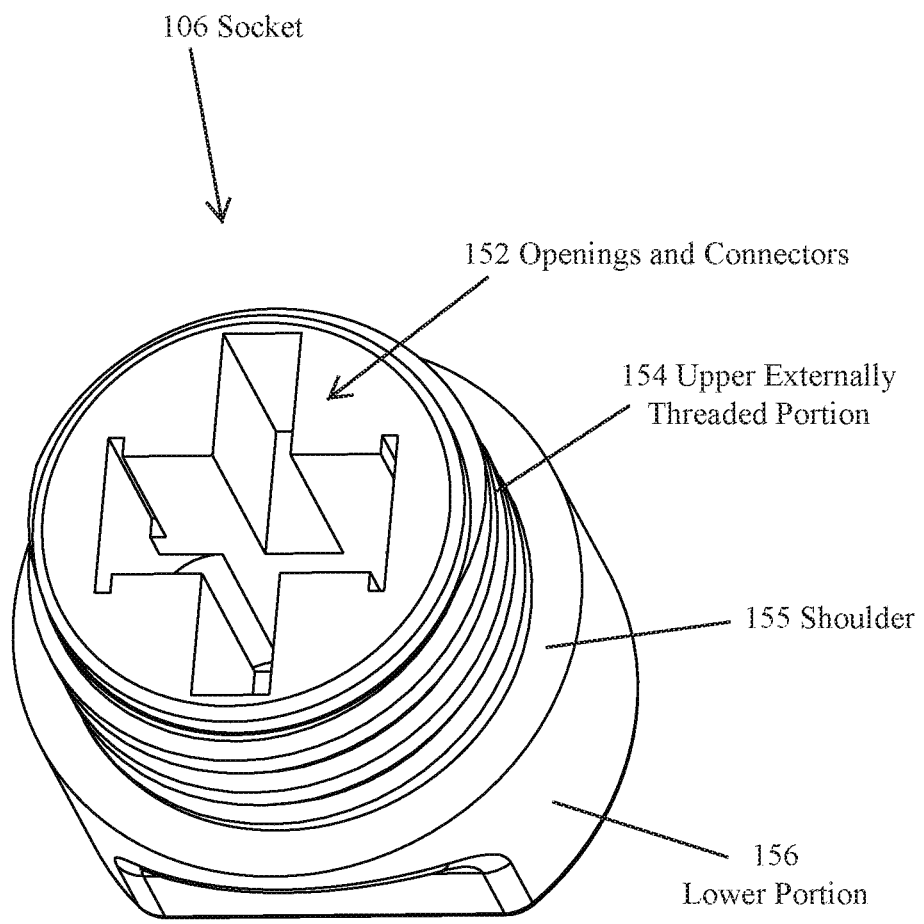
FIG. 4 is a top isometric view of an upper portion of an embodiment of a socket.

FIG. 4 is a top isometric view of socket 106. As shown in FIG. 4, the socket 106 has various openings and connectors 152 that engage the terminal extension 144 (FIG. 3) when the LED lighting source 104 is plugged into the socket 106. Socket 106 has an upper externally threaded portion 154, which is a standard spiral thread, and a lower portion 156, which is not threaded. A shoulder 155 is provided between the upper externally threaded portion 154 and the lower portion 156.

Figure 5:
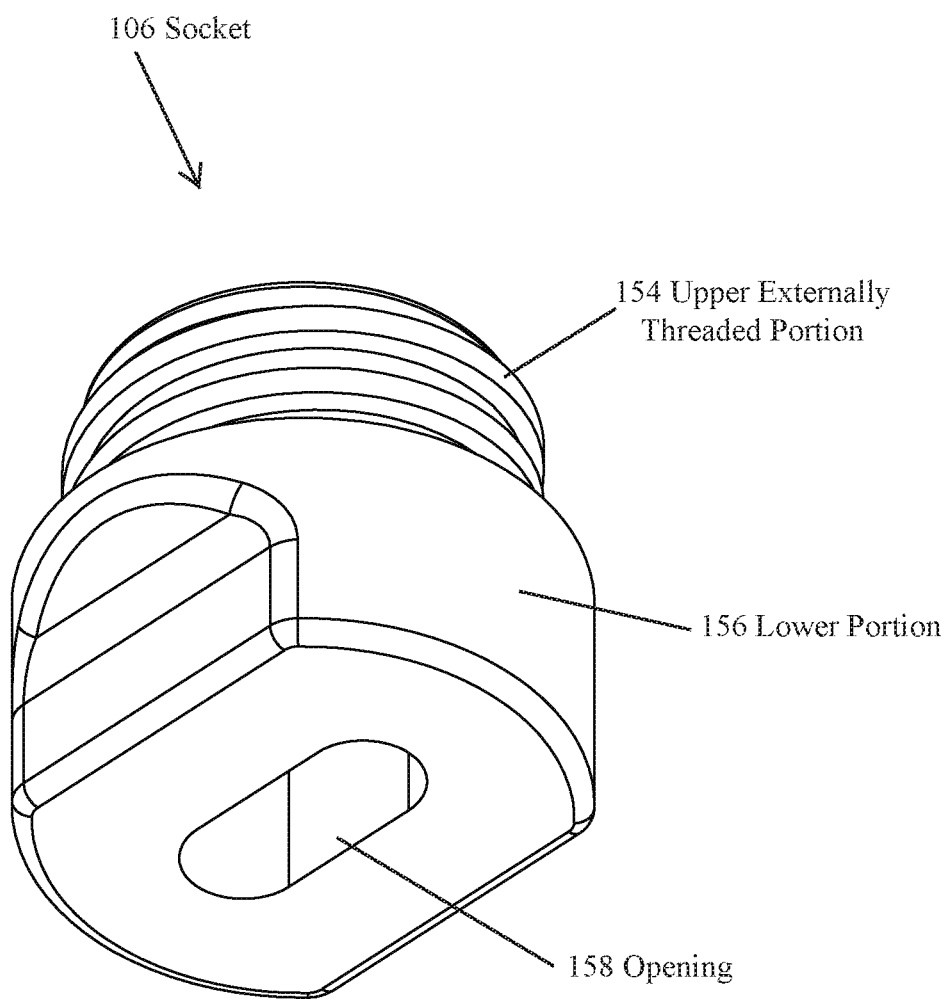
FIG. 5 is a bottom isometric view of a lower portion of an embodiment of the socket in FIG. 4.

FIG. 5 is a bottom isometric view of the socket 106. Again, the upper portion of the socket 106 has an upper externally threaded portion 154. The lower portion 156 has an opening 158, in which two wires are inserted, as explained in more detail below.

Figure 6:
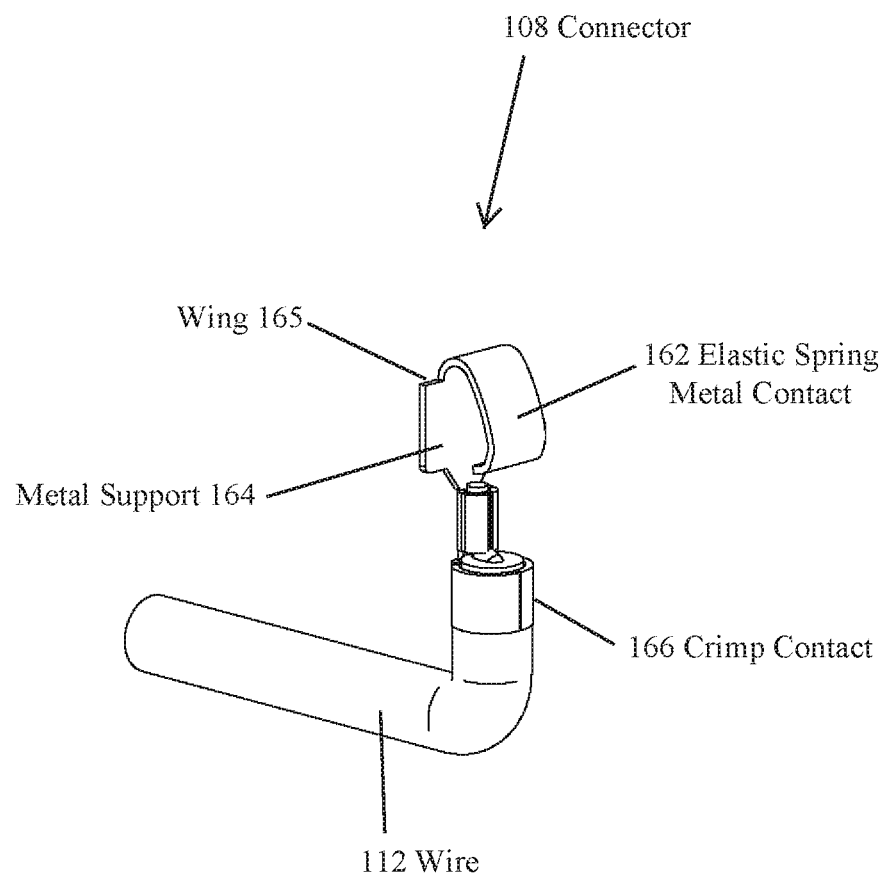
FIG. 6 is an isometric view of an embodiment of a connector.

FIG. 6 is an isometric view of a connector 108 that is connected to wire 112. The connector 108 has a metal support portion 164 to which an elastic spring metal contact 162 is connected. The metal support 164 and the elastic spring metal contact 162 may be constructed of spring steel. The elastic spring metal contact 162 is biased in an outward position, as shown in FIG. 6. Metal support 164 also includes a wing 165 that fits into socket 106 (FIG. 1). Connector 108 also has a crimp contact 166 that crimps onto the upper portion of wire 112 and provides an electrical connection between wire 112 and the connector 108.

Figure 7:
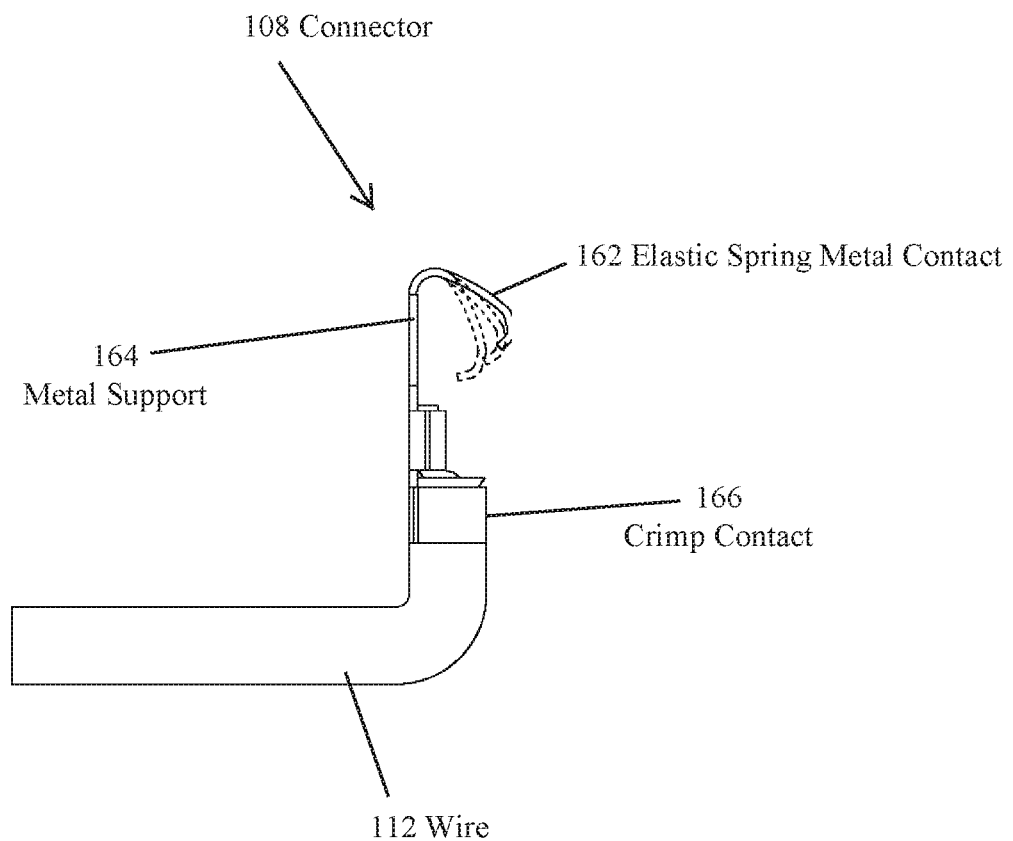
FIG. 7 is a side view of the embodiment of the connector illustrated in FIG. 6.

FIG. 7 is a side view of the connector 108 illustrated in FIG. 6. Again, the metal support 164 and elastic spring metal contact 162 are made of spring steel. The elastic spring metal contact 162 is biased in an outward direction and can be compressed inwardly using a compression force to maintain the elastic spring metal contact 162 closer to the metal support 164. Crimp contact 166 provides an electrical connection between the elastic spring metal contact 162 and wire 112.

Figure 8:
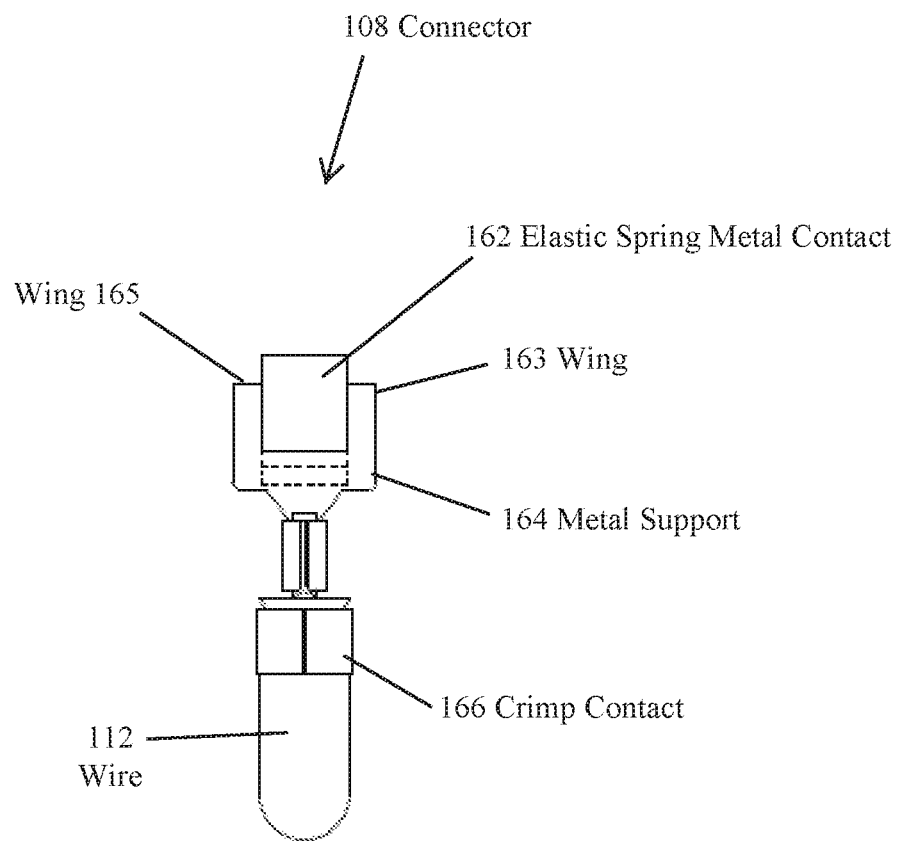
FIG. 8 is an end view of the embodiment of the connector of FIG. 6.

FIG. 8 is an end view of the connector 108. As illustrated in FIG. 8, the metal support 164 includes wings 163, 165 that project outwardly from the elastic spring metal contact 162. As described below, the wings 163, 165 fit within a depressed portion of the socket 106 (FIG. 1). FIG. 8 also illustrates the crimp contact 166, which provides an electrical connection with wire 112.

Figure 9:
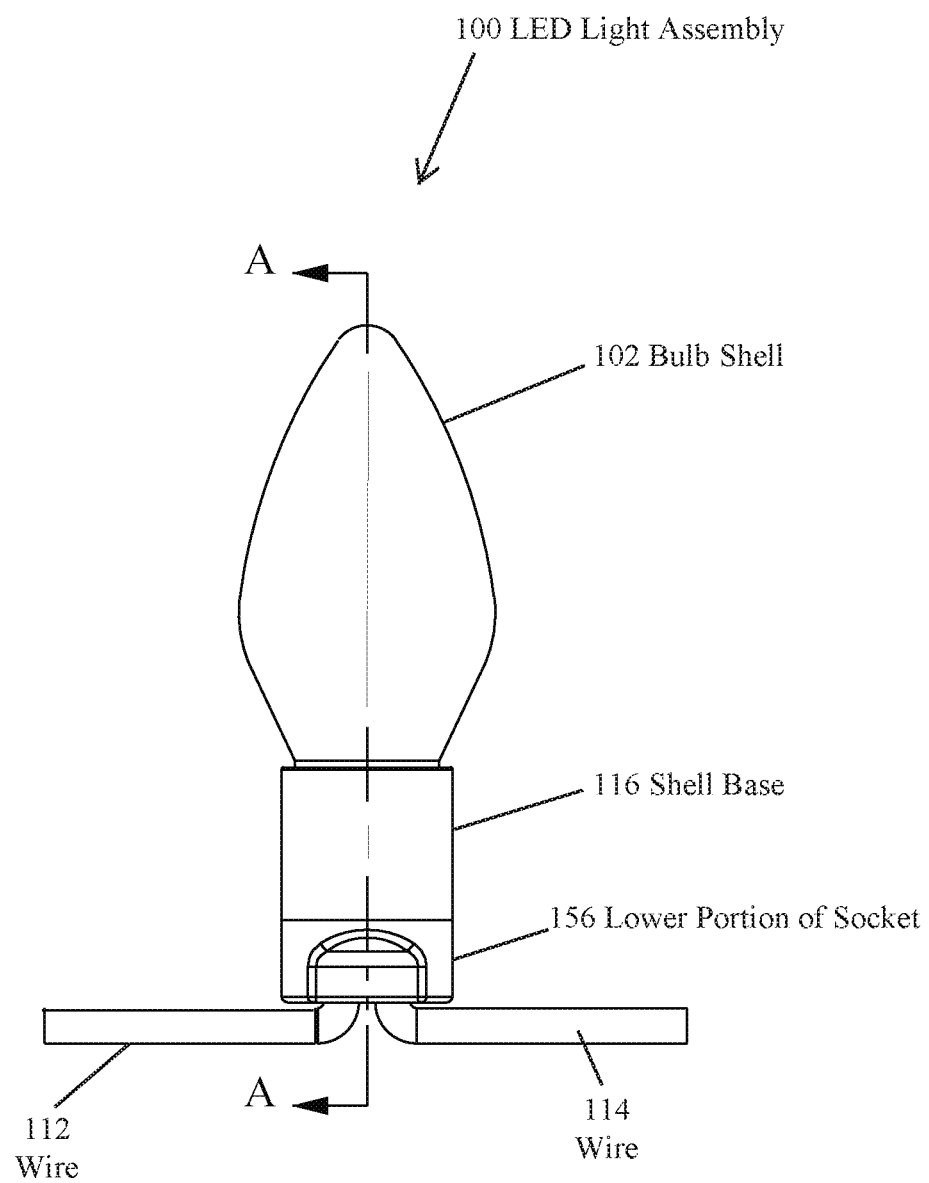
FIG. 9 is a side view of the LED light assembly.

FIG. 9 is a side view of the LED light assembly 100. As illustrated in FIG. 9, wire 112 and wire 114 are inserted in an opening in the lower portion 156 of the socket 106 (FIG. 1). Shell base 116 is screwed onto the socket 106 (FIG. 1). Bulb shell 102 is inserted into the shell base 116 with a friction fit or other manner of fitting. FIG. 9 illustrates a cross section A-A that is illustrated in FIG. 10.

Figure 10:
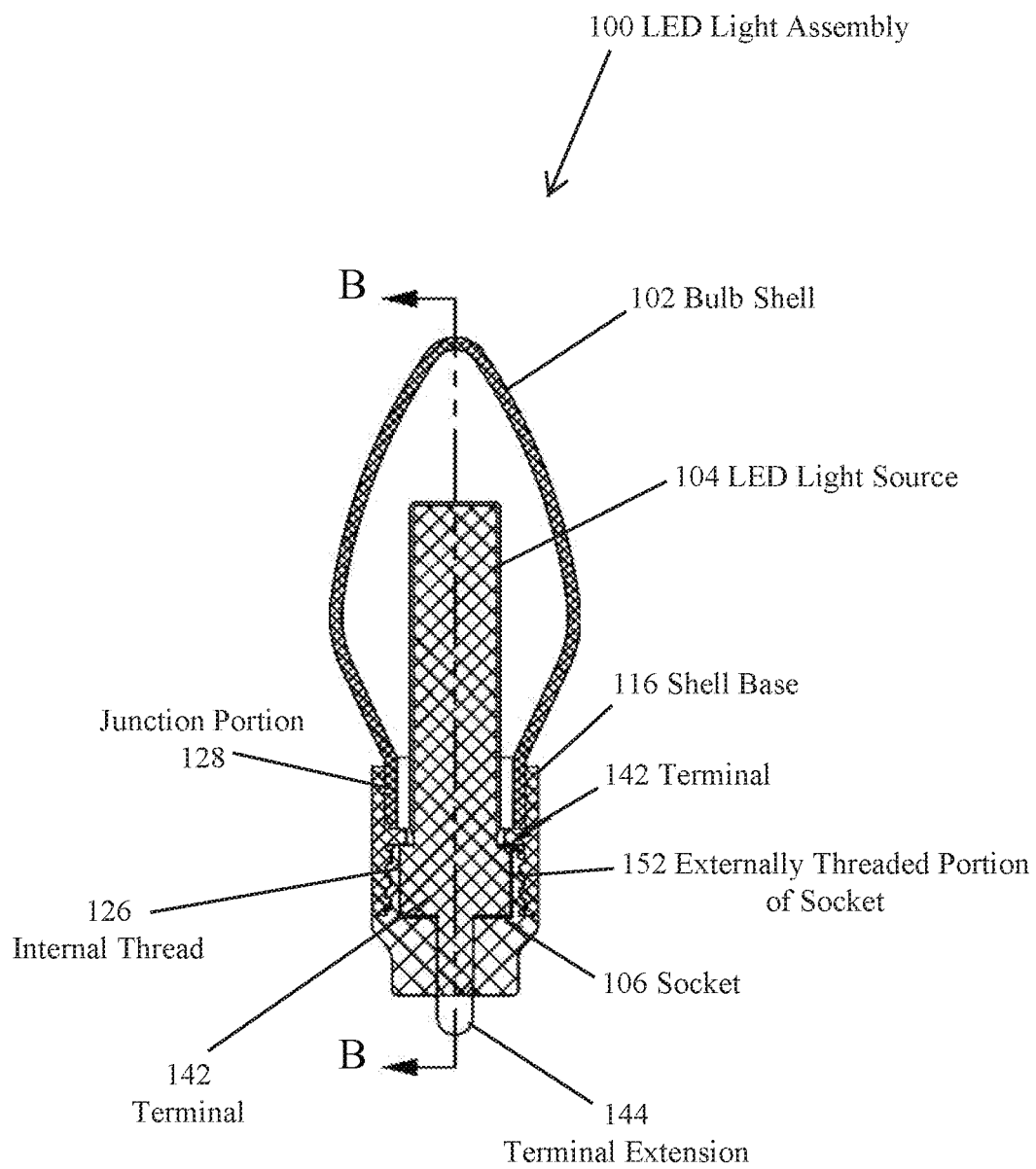
FIG. 10 is a cutaway view, showing section A-A of FIG. 9.

FIG. 10 is a cross-sectional view of the LED light assembly 100, as illustrated by the cross section A-A of FIG. 9. As illustrated in FIG. 10, bulb shell 102 covers the LED lighting source 104. The shell base 116 fits around the junction portion 128 of bulb shell 102 using a friction fit. The internal thread 126 of shell base 116 engages the externally threaded portions 152 of the socket 106. The terminal 142 fits within the opening in the socket 106. The terminal extension 144 extends through the socket 106.

Figure 11:
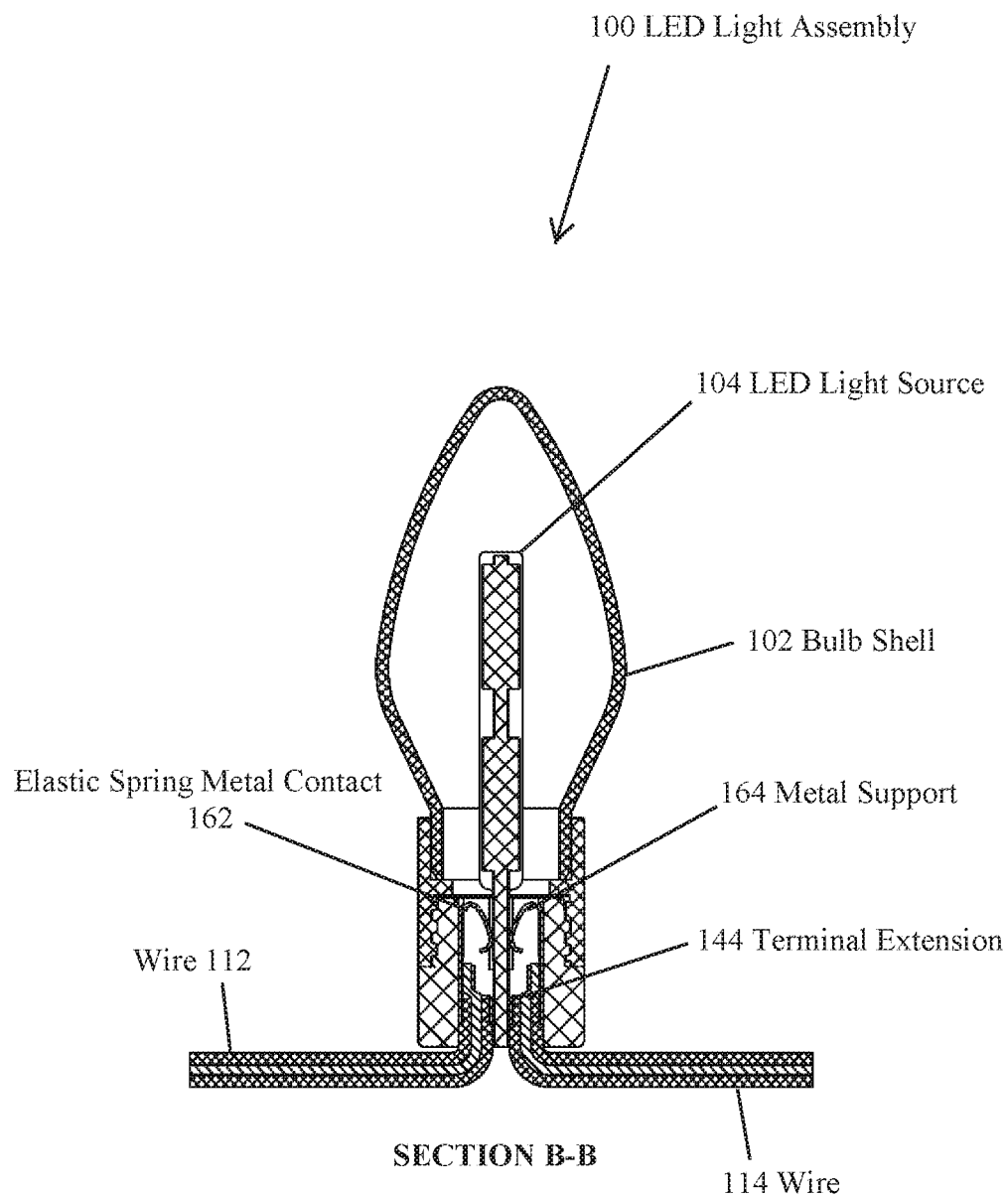
FIG. 11 is a cutaway view showing section B-B of FIG. 10.

FIG. 11 is a cross-sectional view of section B-B illustrated in FIG. 10. As shown in FIG. 11, the bulb shell 102 covers and surrounds the LED lighting source 104. As also illustrated in FIG. 11, the terminal extension 144 is inserted between the elastic spring metal contacts 162, 164 so that the elastic spring metal contacts 162, 164 firmly contact the terminal extension 144, and apply pressure to conductors on the terminal extension 144. In this manner, the elastic spring metal contacts 162, 164 supply power to the LED lighting source 104 and allow the electric power to flow from wire 112 through the LED lighting source 104 to wire 114.

Figure 12:
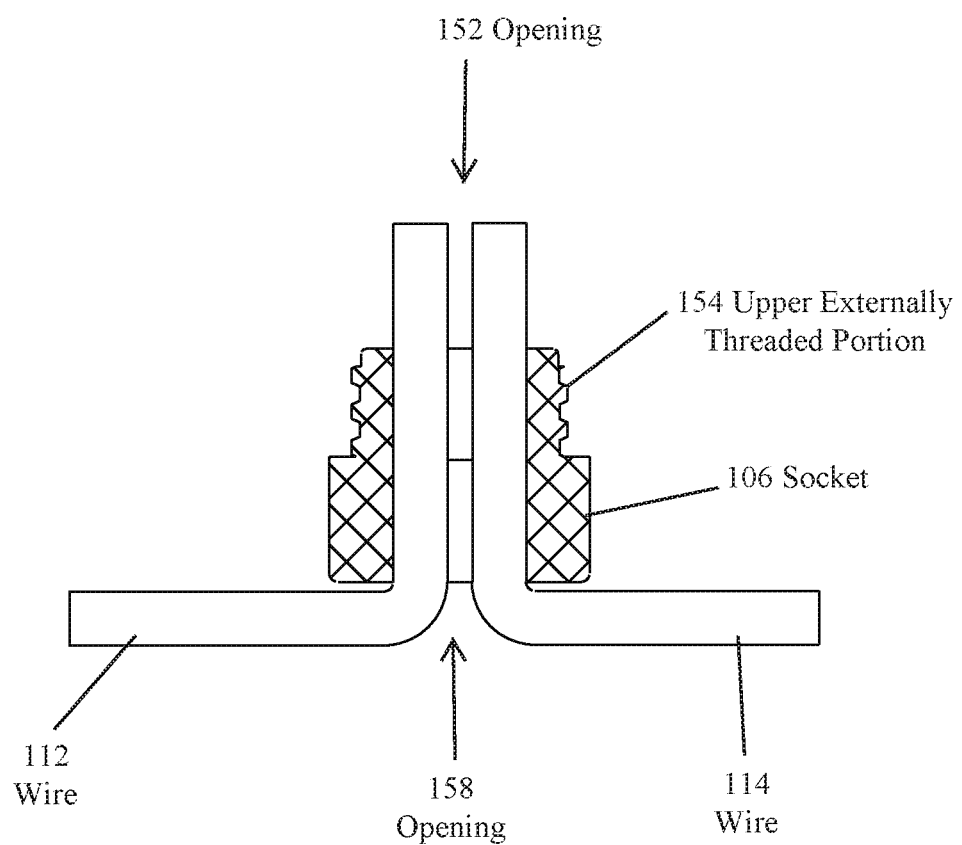
FIG. 12 is a partial cutaway view illustrating the manner in which the wires are inserted through the socket.

FIG. 12 is a side cutaway view of the manner in which wires 112, 114 are inserted in the socket 106. Socket 106 has an opening 158 that is illustrated in FIG. 5 and in FIG. 12, through which wires 112, 114 are inserted. The wires initially extend through the upper externally threaded portion 154 and through opening 152.

Figure 13:
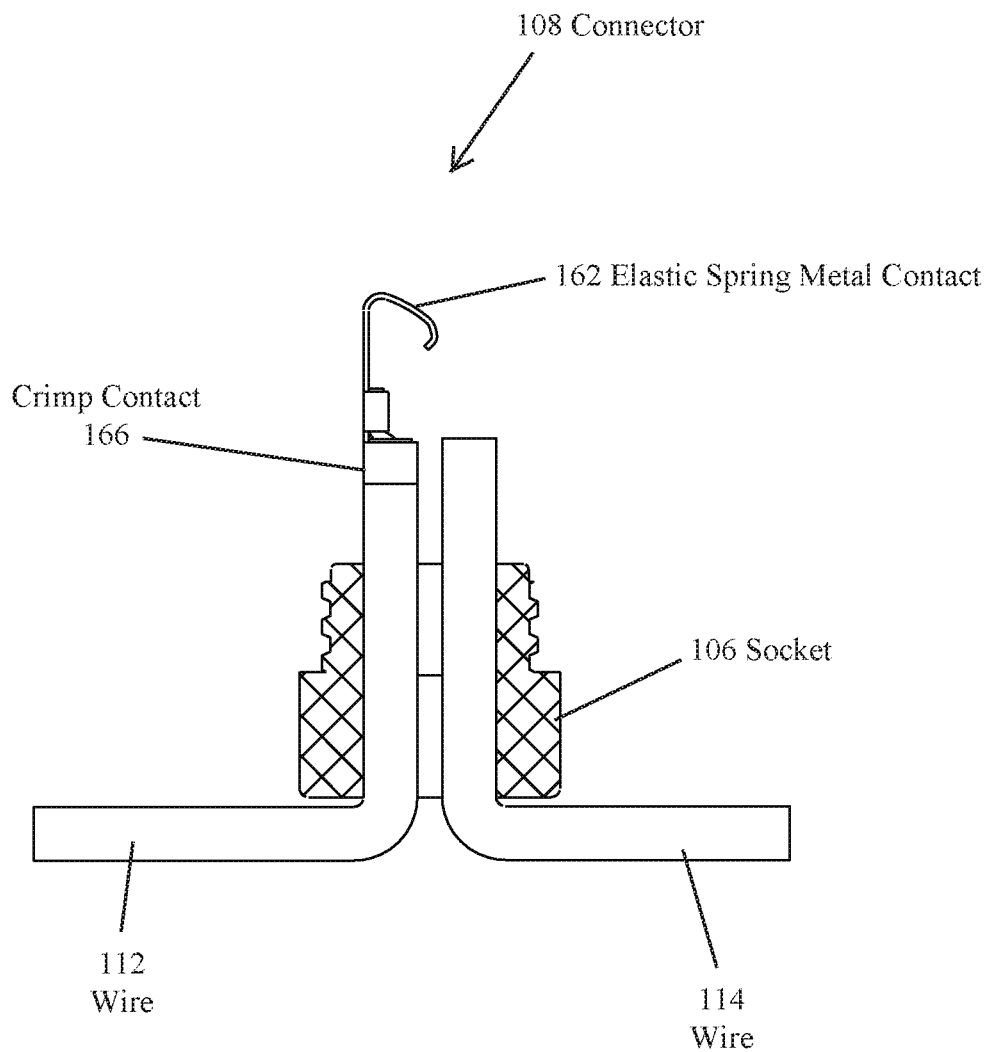
FIG. 13 is a partial cutaway view illustrating the manner in which a contact is attached to one of the wires.

FIG. 13 is a side partial cutaway view of the wires 112, 114 and socket 106. As illustrated in FIG. 13, a crimp contact 166 is connected to wire 112 to form the connector 108. This is accomplished while the wires 112, 114 extend through the socket 106, as illustrated in FIG. 12.

Figure 14:
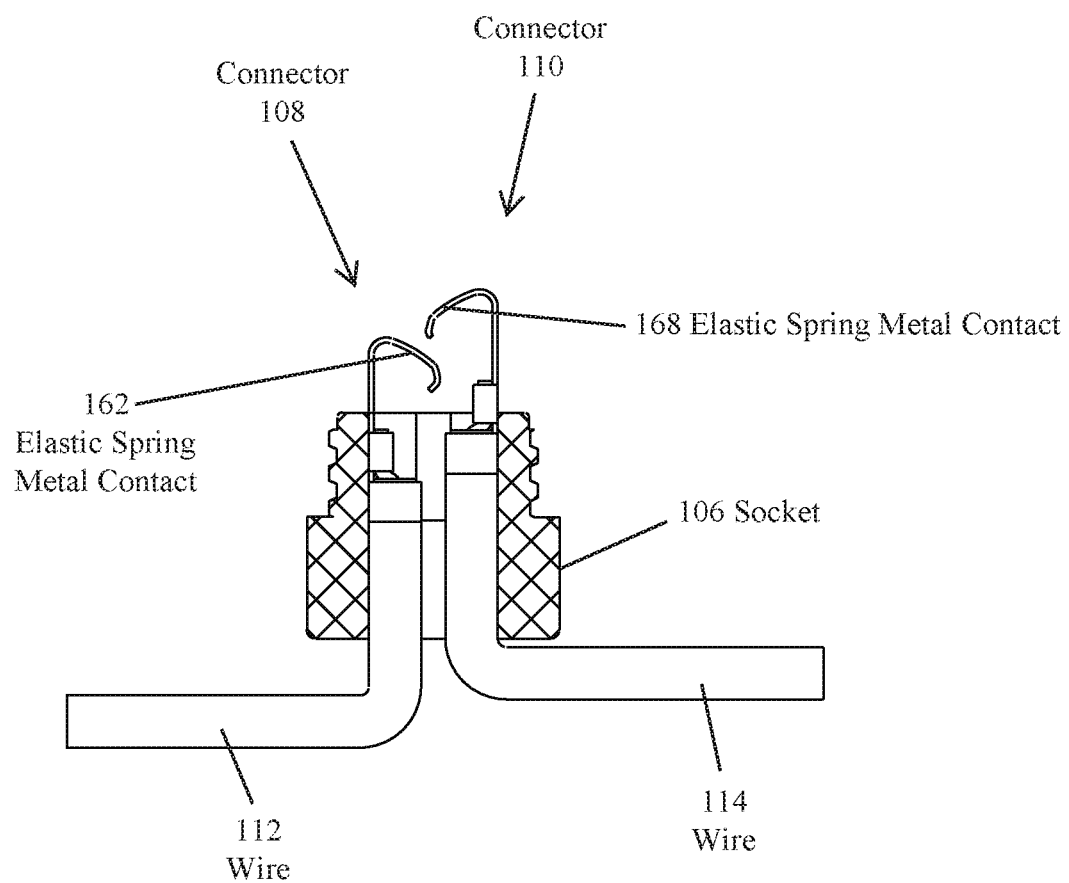
FIG. 14 is a partial cutaway view illustrating the manner in which one wire is pulled partially into the socket with a connector and another connector is connected to the other wire.

FIG. 14 is a side partial cutaway view of socket 106 and wires 112, 114. As illustrated in FIG. 14, wire 112 has been pulled a short distance back into the socket 106, so that connector 108 is partially disposed within the socket 106. Additionally, connector 110 has been attached to wire 114 and pulled a shorter distance into the socket 106. The elastic spring metal contacts 162, 168 of connectors 108, 110, respectively, overlap each other and are compressed so that the electric spring metal contacts 162, 168 engage each other when connectors 108, 110 are fully disposed within socket 106, as illustrated in FIG. 15.

Figure 15:
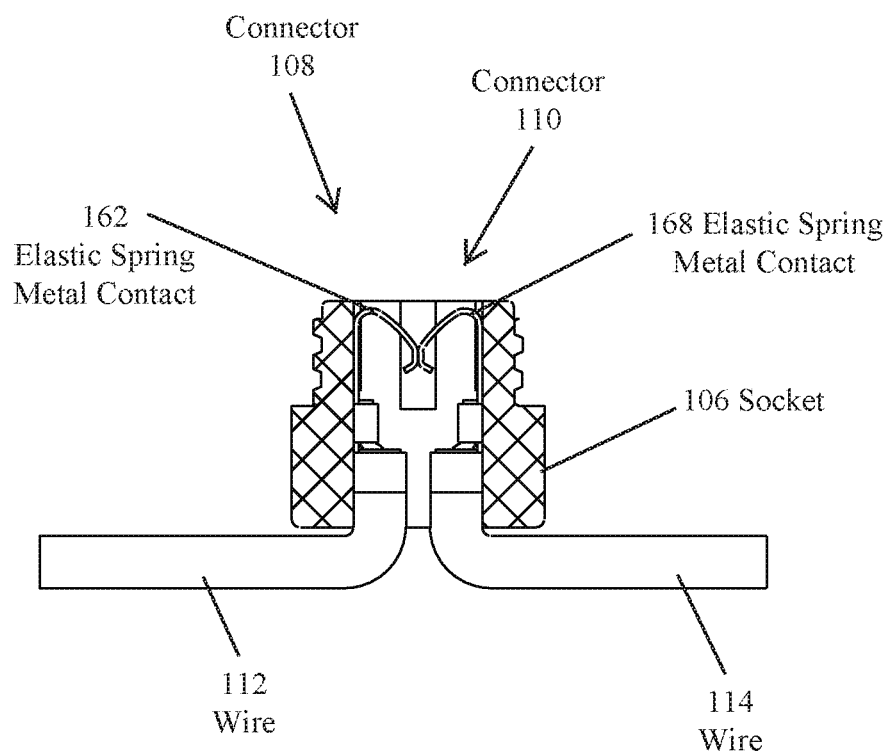
FIG. 15 is a partial cutaway view illustrating the wires and connectors pulled into the socket and the manner in which the contacts of the connectors are touching.

FIG. 15 is a partial cutaway view of socket 106 with the connectors 108, 110 fully disposed within the socket 106. As shown in FIG. 15, the wires 112, 114 have been used to pull the connectors 108, 110 into the socket 106. Simultaneously, elastic spring metal contacts 162, 168 are compressed so that they fit within the opening of the socket 106 and are pressed against each other to complete an electrical circuit between wire 112 and wire 114. The elastic spring metal contacts 162, 168 press against each other in response to the force created by the spring steel of the elastic spring metal contacts 162, 168.

Figure 16:
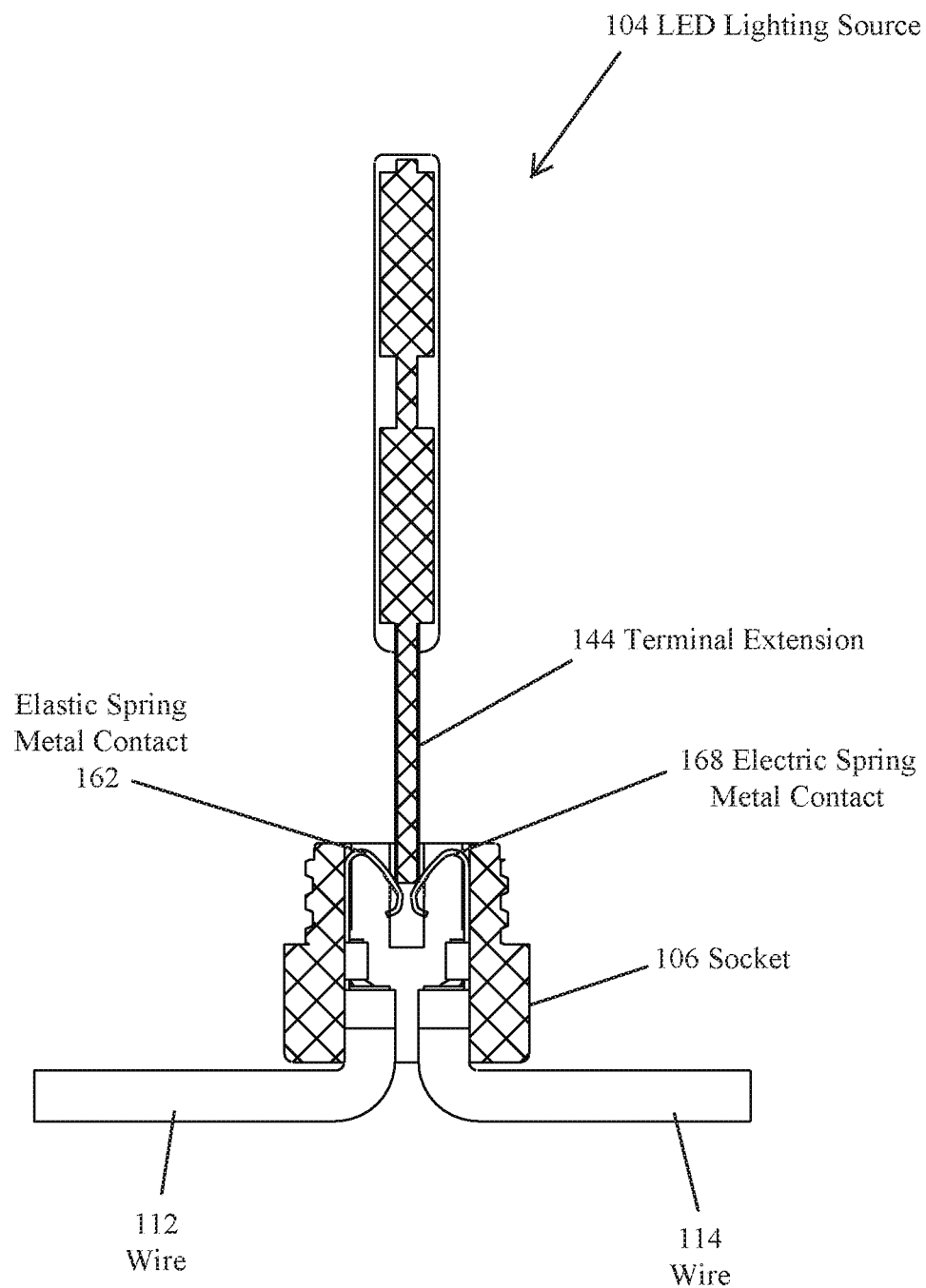
FIG. 16 is a partial cutaway view showing the LED lighting source partially inserted between the electric spring contacts.

FIG. 16 is a side partial cutaway view illustrating the manner in which the LED lighting source 104 is inserted in the socket 106. As illustrated in FIG. 16, the terminal extension 144 is inserted between electric spring metal contact 162 and electric spring metal contact 168. The electric spring metal contacts 162, 168 are compressed and push against the terminal extension 144. The terminal extension 144 has terminal conductors disposed on each side, which contact the electric spring metal contacts 162, 168, to supply power to the LED lighting source 104.

Figure 17:
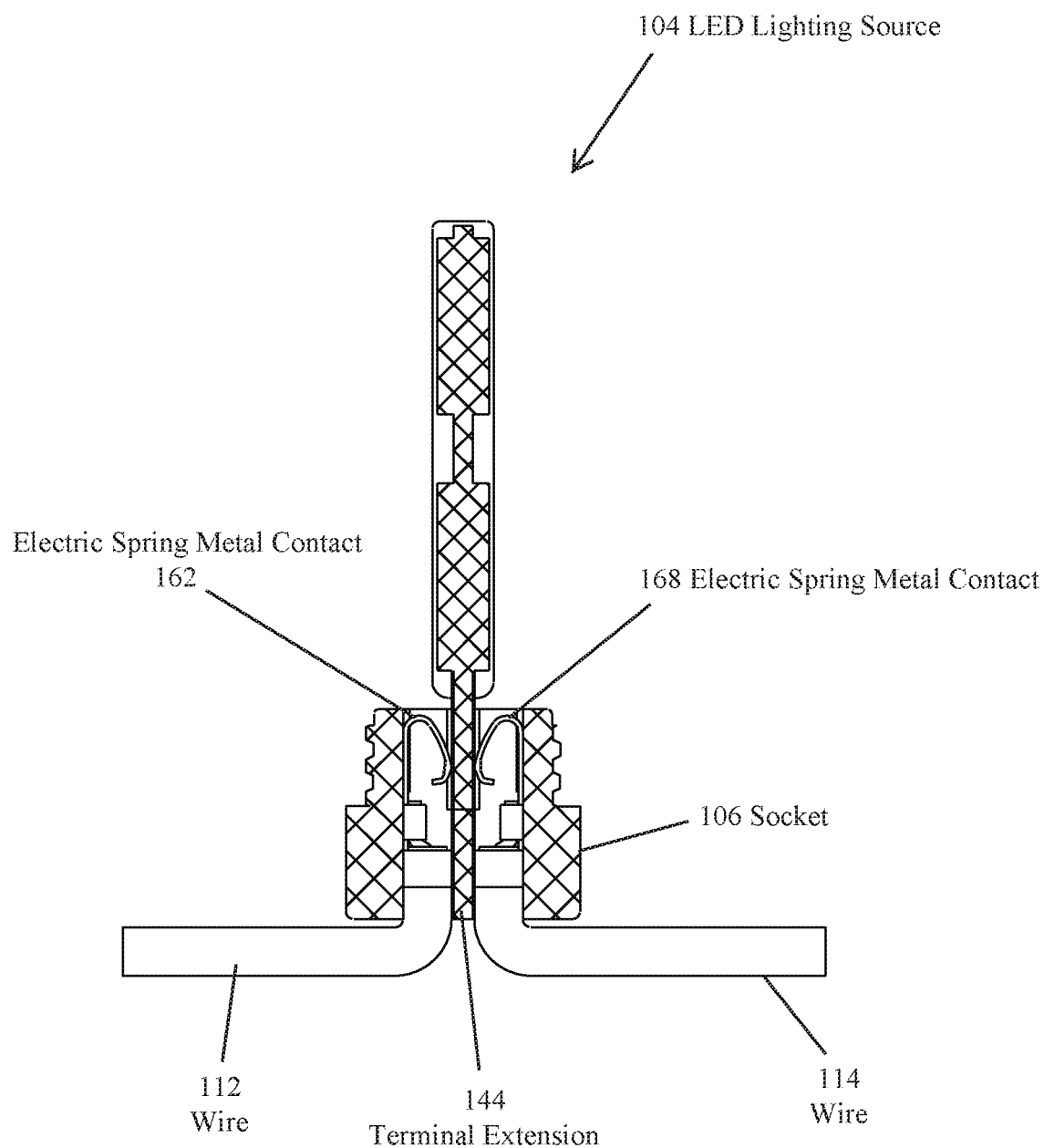
FIG. 17 is a side partial cutaway view illustrating the LED lighting source fully inserted between the electrical spring contacts.

FIG. 17 is a side partial cutaway view of the socket 106 and LED lighting source 104. As illustrated in FIG. 17, the LED lighting source 104 is fully inserted into the socket 106 so that the electric spring metal contacts 162, 168 contact the terminals on the LED lighting source 104 to supply power to the LED lighting source 104. The terminal extension 144 extends down between the wires 112, 114.

Figure 18:
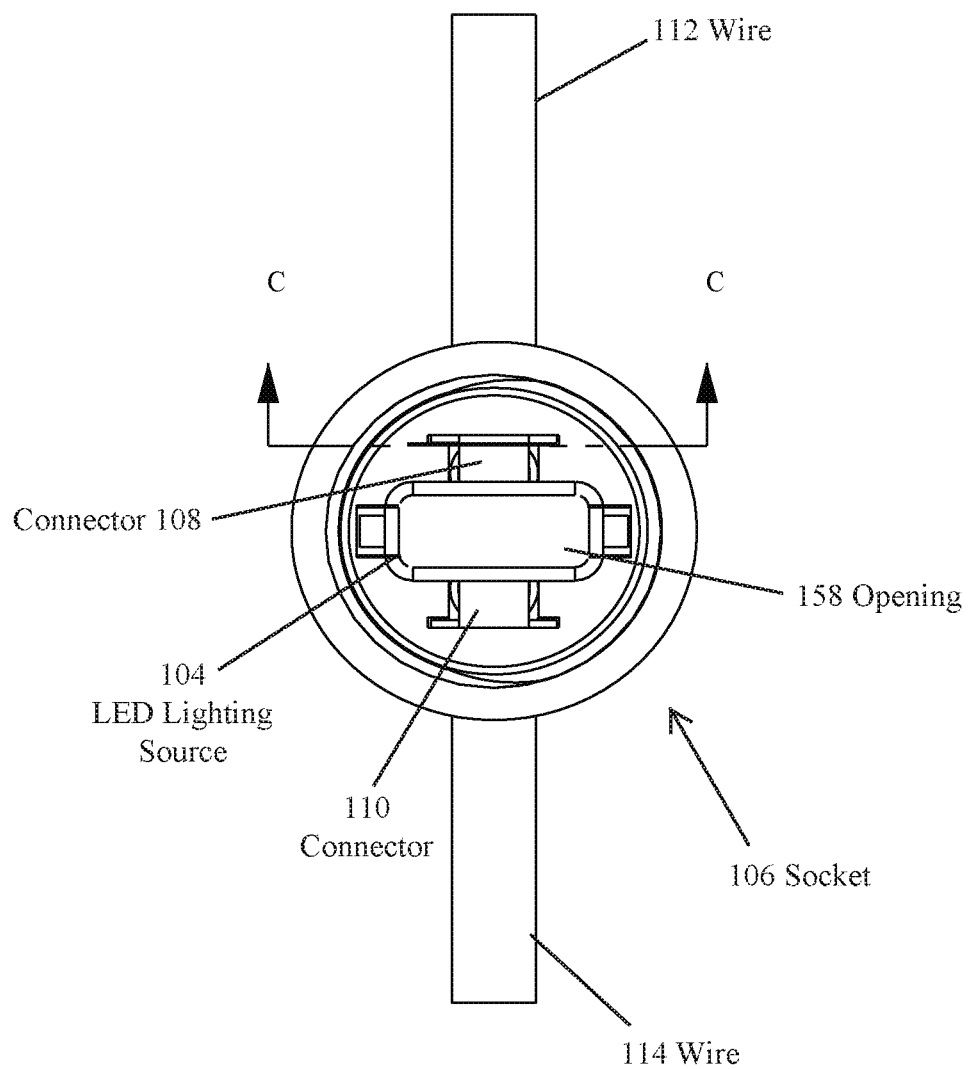
FIG. 18 is a top view of the socket illustrated in FIGS. 4 and 5.

FIG. 18 is a top view of socket 106. As shown in FIG. 18, connectors 108, 110 are disposed in the socket 106 and are connected to wires 112, 114, respectively. The LED lighting source 104 is disposed in the opening 158 of the socket 106. Connector 108 is attached to wire 112 and connector 110 is connected to wire 114.

Figure 19:
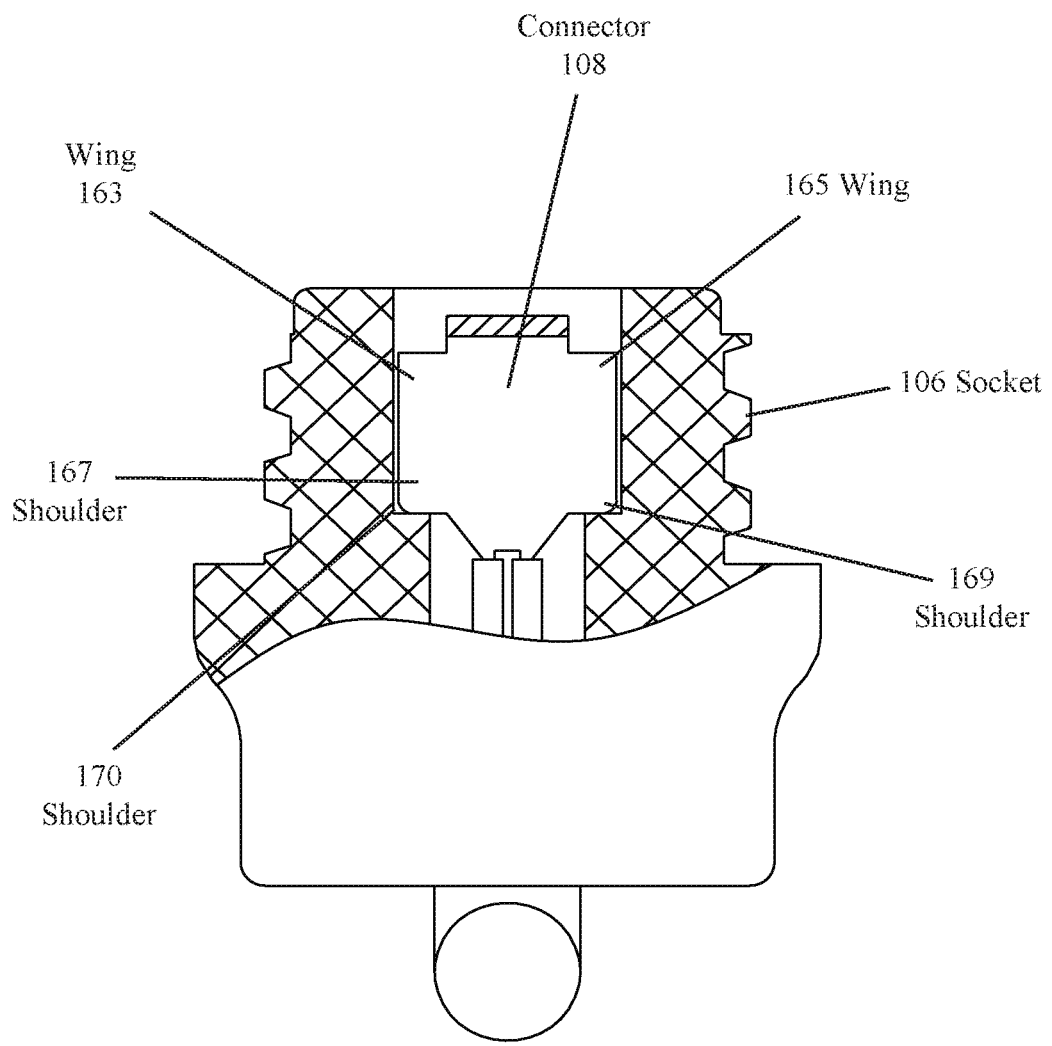
FIG. 19 is a partial cutaway view of the socket along section C-C of FIG. 18.

FIG. 19 is a partial cutaway view of the socket 106, which is a sectional view C-C illustrated in FIG. 18. As shown in FIG. 19, the connector has wings 163, 165, which fit along the width of the opening in the socket 106. The shoulders 167, 169 of the wings 163, 165 fit on the shoulder 170 formed by the opening in the socket 106. In this manner, the connector 108 can be fully seated within the socket 106.

Consequently, the LED light assembly 100, in accordance with the present invention, provides a replaceable surface mounted, high brightness LED that can be easily accessed and replaced. The surface mounted, high brightness LED circuit board includes all of the necessary elements for controlling the intensity and color of the surface mounted LEDs. A socket is provided that houses connectors that allow a circuit board with surface mounted LEDs to be inserted and removed from the socket for replacement of the LEDs. The socket has a screw thread that allows a bulb shell that surrounds the surface mounted LEDs to be removed for replacement of the surface mounted LEDs. The connectors are made of spring steel and provide a connection if the circuit board having the surface mounted LEDs becomes loose or removed from the socket. In this manner, a series connected LED light string can continue to be lit if the circuit board having the surface mounted LEDs becomes loose or is removed.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of connecting high brightness, surface mounted light emitting diodes mounted on a circuit board in series that allows said high brightness, surface mounted light emitting diodes to be replaced comprising:
using spring steel that is biased in an outward position to form two contacts;
placing two wires in an opening in a socket, said socket having a threaded surface;
electrically connecting said two contacts to said two wires to form two connectors;
placing said two connectors in said opening in said socket so that said two contacts are compressed against each other and form an electrical connection between said two wires;
inserting an extended portion of said circuit board between said two contacts so that terminals on said circuit board are electrically connected to said two connectors, which provides electrical power to said surface mounted, high brightness light emitting diodes.

2. The method of claim 1 further comprising:
removing said extended portion of said circuit board from between said two contacts whenever said surface mounted, high brightness light emitting diodes are burned out, causing said two contacts to compress against each other and form said electrical connection between said two wires.

3. The method of claim 2 further comprising:
replacing said circuit board having burned out surface mounted, high brightness light emitting diodes with a replacement circuit board having surface mounted, high brightness light emitting diodes mounted on said replacement circuit board having an extended portion that is inserted between said two contacts;
placing a removable bulb shield around said circuit board.

4. An LED light assembly comprising:
two wires that supply electrical power to said LED light assembly;
two connectors attached to said two wires, said connectors made of spring steel that is biased in an outward direction;
a socket that surrounds said two connectors so that said two connectors are compressed against each other;
an LED lighting source comprising:
a circuit board;
a plurality of LEDs that are surface mounted on said circuit board;

electrical components that are mounted on said circuit board that generate power signals that control luminosity of said plurality of LEDs;

terminals disposed on said circuit board that are electrically connected to said electrical components, said terminals disposed between said two connectors in said socket to supply electrical power and control signals from said two wires to said LED lighting source;

a bulb shell that is removeably attached to said socket that provides access to said LED light source when removed from said socket.

5. The LED light assembly of claim 4 wherein said plurality of LEDs are different colors and are controlled by said control signals.

6. The LED light assembly of claim 4 wherein said LED light source is removable from said socket.

7. The LED light assembly of claim 4 wherein said socket has threaded connections that allow said bulb shell to be removed from said socket to gain access to said LED light assembly.

\* \* \* \* \*